(12) United States Patent
Endres et al.

(10) Patent No.: US 8,466,703 B2
(45) Date of Patent: Jun. 18, 2013

(54) PROBE CARD ANALYSIS SYSTEM AND METHOD

(75) Inventors: Eric Endres, Issaquah, WA (US); John T. Strom, North Bend, WA (US); Christian Kuwasaki, Sammamish, WA (US); Christopher McLaughlin, Minneapolis, MN (US)

(73) Assignee: Rudolph Technologies, Inc., Flanders, NJ (US)

( * ) Notice: Subject to any disclaimer, the term of this patent is extended or adjusted under 35 U.S.C. 154(b) by 270 days.

(21) Appl. No.: 12/862,375

(22) Filed: Aug. 24, 2010

(65) Prior Publication Data

US 2011/0089965 A1    Apr. 21, 2011

Related U.S. Application Data

(60) Continuation-in-part of application No. 11/960,597, filed on Dec. 19, 2007, now Pat. No. 7,782,071, and a continuation-in-part of application No. 12/547,118, filed on Aug. 25, 2009, which is a continuation of application No. 12/136,693, filed on Jun. 10, 2008, now Pat. No. 7,579,853, which is a continuation of application No. 11/609,881, filed on Dec. 12, 2006, now Pat. No. 7,385,409, which is a division of application No. 10/799,575, filed on Mar. 12, 2004, now Pat. No. 7,170,307.

(60) Provisional application No. 60/870,832, filed on Dec. 19, 2006, provisional application No. 60/871,449, filed on Dec. 21, 2006, provisional application No. 60/454,574, filed on Mar. 14, 2003.

(51) Int. Cl.
*G01R 1/067*    (2006.01)

(52) U.S. Cl.
USPC ............ 324/755.01; 324/755.05; 324/750.16; 324/756.03

(58) Field of Classification Search
USPC .............. 324/755.01, 755.05, 750.16, 756.03
See application file for complete search history.

(56) References Cited

U.S. PATENT DOCUMENTS

| | | | |
|---|---|---|---|
| 4,918,374 A * | 4/1990 | Stewart et al. ........... | 324/750.22 |
| 5,422,579 A | 6/1995 | Yamaguchi | |
| 5,508,629 A | 4/1996 | Stewart et al. | |
| 5,510,723 A | 4/1996 | Canella et al. | |
| 5,561,377 A | 10/1996 | Strid et al. | |
| 5,831,443 A * | 11/1998 | Quarre et al. ............ | 324/750.01 |
| 5,974,662 A | 11/1999 | Eldridge et al. | |
| 6,127,831 A | 10/2000 | Khoury et al. | |
| 6,211,960 B1 * | 4/2001 | Hembree ...................... | 356/400 |

(Continued)

FOREIGN PATENT DOCUMENTS

| | | |
|---|---|---|
| EP | 1061381 A2 | 12/2000 |
| JP | 2005079253 A | 3/2005 |

(Continued)

*Primary Examiner* — Arleen M Vazquez
(74) *Attorney, Agent, or Firm* — Dicke, Billig & Czaja, PLLC

(57) ABSTRACT

A system and method for evaluating wafer test probe cards under real-world wafer test cell condition integrates wafer test cell components into the probe card inspection and analysis process. Disclosed embodiments may utilize existing and/or modified wafer test cell components such as, a head plate, a test head, a signal delivery system, and a manipulator to emulate wafer test cell dynamics during the probe card inspection and analysis process.

11 Claims, 13 Drawing Sheets

U.S. PATENT DOCUMENTS

| | | |
|---|---|---|
| 6,420,891 B1 | 7/2002 | Liu |
| 6,686,753 B1 | 2/2004 | Kitahata |
| 6,710,798 B1 * | 3/2004 | Hershel et al. .................. 348/87 |
| 6,809,536 B2 * | 10/2004 | Suzuki ..................... 324/754.07 |
| 6,870,382 B2 | 3/2005 | Harris |
| 6,911,814 B2 | 6/2005 | Miller et al. |
| 7,016,260 B2 | 3/2006 | Bary |
| 7,170,307 B2 | 1/2007 | Strom |
| 7,231,081 B2 | 6/2007 | Snow et al. |
| 7,385,409 B2 | 6/2008 | Strom |
| 7,579,853 B2 | 8/2009 | Strom |
| 2003/0142862 A1 | 7/2003 | Snow et al. |
| 2004/0222808 A1 | 11/2004 | Strom et al. |

FOREIGN PATENT DOCUMENTS

| | | |
|---|---|---|
| JP | 2006023229 A | 1/2006 |
| WO | 01/08819 A1 | 2/2001 |
| WO | 2005/005996 A2 | 1/2005 |

* cited by examiner

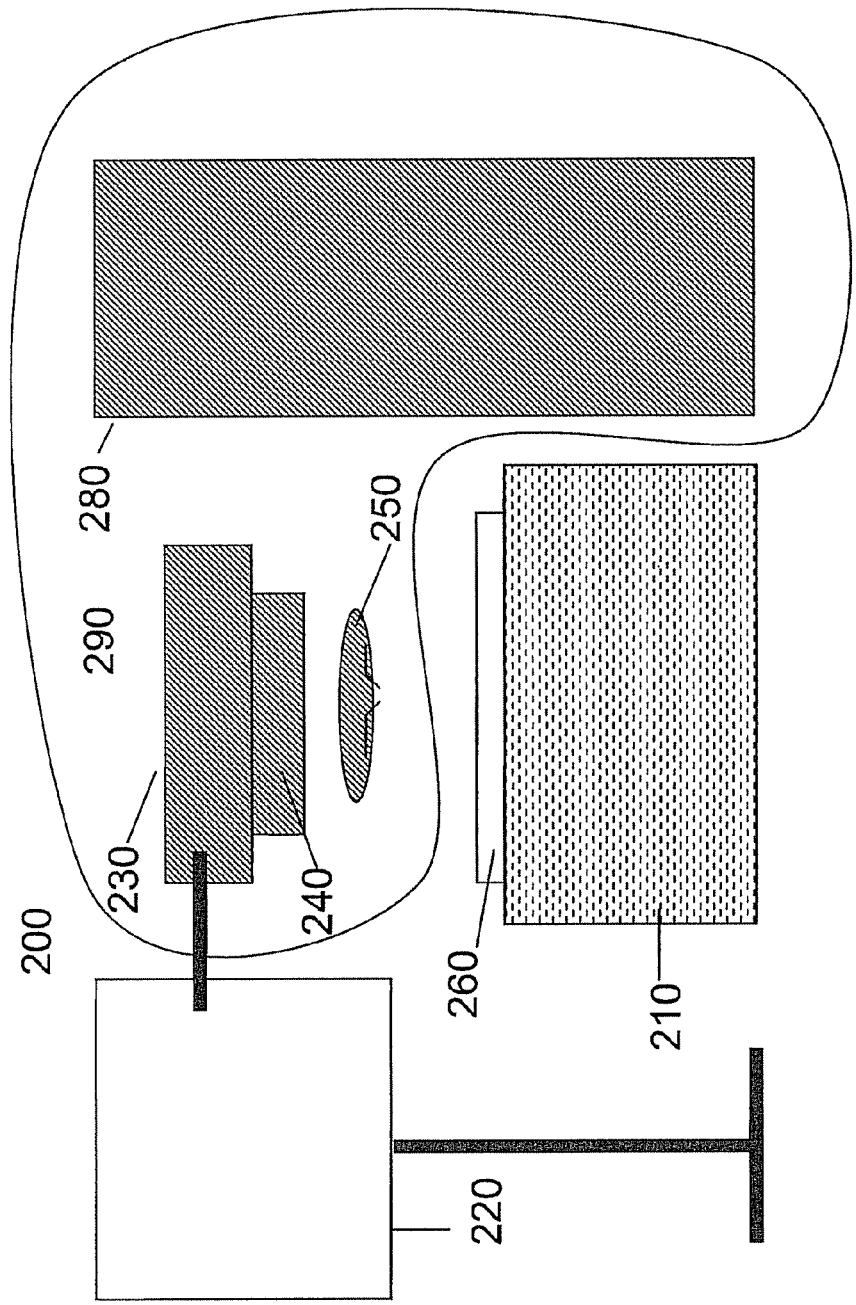

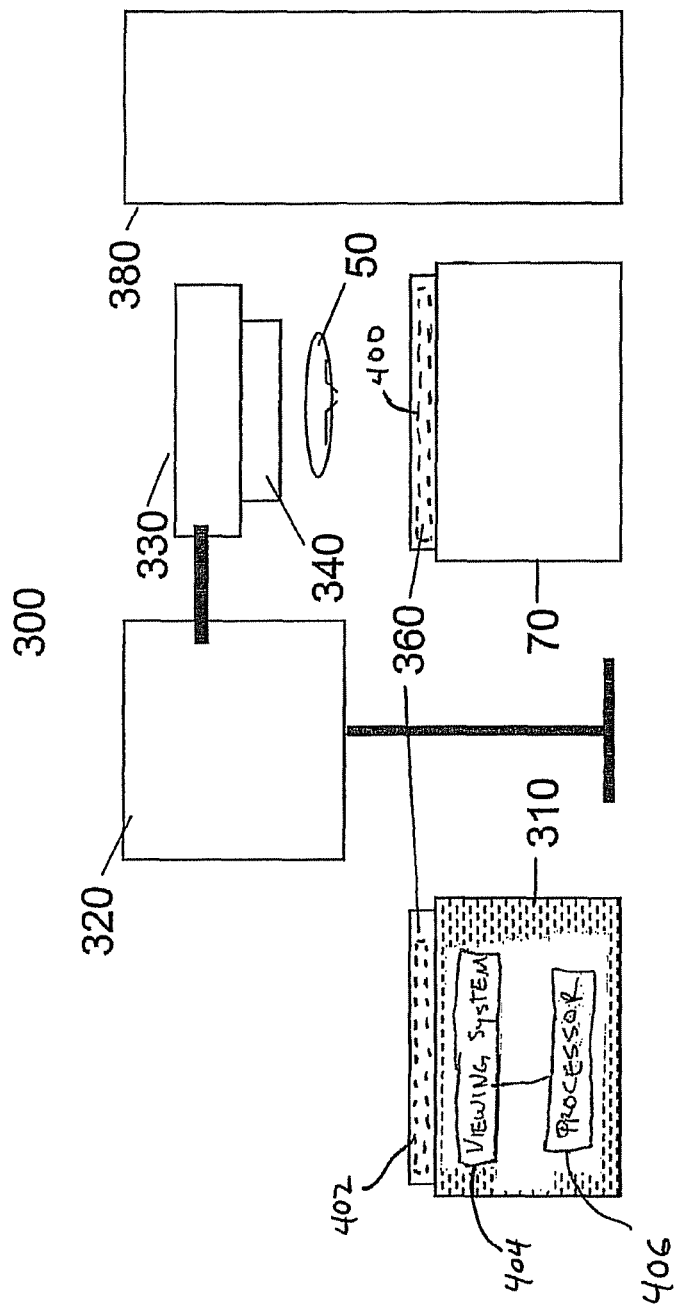

PROBE CARD ANALYSIS SYSTEM AND METHOD

CROSS-REFERENCE TO RELATED APPLICATIONS

This application is a continuation-in-part of U.S. patent application Ser. No. 11/960,597 entitled "PROBE CARD ANALYSIS SYSTEM AND METHOD", filed Dec. 19, 2007, which claims the benefit of Provisional Application Ser. No. 60/870,832 entitled "PROBE CARD ANALYSIS SYSTEM AND METHOD," filed Dec. 19, 2006, and Provisional Application Ser. No. 60/871,449 entitled "PROBE CARD ANALYSIS SYSTEM AND METHOD," filed Dec. 21, 2006; this application is a continuation-in-part of U.S. patent application Ser. No. 12/547,118 entitled "An Apparatus for Obtaining Planarity Measurements With Respect to a Probe Card Analysis System", filed Aug. 25, 2009, which is a continuation application of U.S. Pat. No. 7,579,853 entitled "An Apparatus for Obtaining Planarity Measurements With Respect to a Probe Card Analysis System", which is a continuation of U.S. Pat. No. 7,385,409 entitled "System and Method of Mitigating Effects of Component Deflection in a Probe Card Analyzer", which is a divisional application of U.S. Pat. No. 7,170,307 entitled "System and Method of Mitigating Effects of Component Deflection in a Probe Card Analyzer," which claimed the benefit of now abandoned U.S. provisional application Ser. No. 60/454,574, filed Mar. 14, 2003, entitled "System and Method of Mitigating Effects of Component Deflection in a Probe Card Analyzer," the disclosures of which applications are hereby incorporated herein by reference in their entirety and the contents of each of the foregoing applications are hereby incorporated herein by reference in their entirety and for all purposes.

FIELD

This disclosure relates to the field of semiconductor test methods and equipment. More particularly, this disclosure relates to methods and equipment for the inspection and analysis of probe cards used in the testing of semiconductor integrated circuit components.

BACKGROUND

In the semiconductor industry, many replicate components, or die, are created on a single silicon wafer. In order to eliminate faulty die prior to the cost intensive step of packaging, semiconductor fabricators typically perform wafer testing or sorting. The performance characteristics of the die are evaluated in a wafer test cell or test station by establishing electrical connectivity between the bonding pads or bumps present on each individual die and external test equipment.

A variety of wafer test cells components and configurations are possible and FIG. 1 illustrates one wafer test cell configuration. Test cell 10 may incorporate: a probe card or probe array 50 comprising an array of fine wires, formed springs or similar conductive elements known as probe pins; a test head or interface unit 30 upon which a probe array may be structurally coupled or mounted; a signal delivery system 40 which establishes electrical contact between probe array 50 and tester 80; manipulator 20 which functions to support and move test head 30, signal delivery system 40, and probe array 50; a test machine or tester 80 which is electrically coupled to probe array 50 and able to generate, detect and measure electrical signals in a manner suitable to determine the performance of the individual die on the wafer or device under test (DUT); a prober 70 which aligns the wafer to probe array 50 such that the probe pins make accurate contact with the wafer bonding pads; and a head plate 60 which facilitates docking or mating between prober 70 and the other test cell components.

In practice, wafer test cell 10 may utilize one tester controlling one or more probers with each prober contacting one or multiple DUTs of one wafer at a time. A wafer is loaded and positioned horizontally with bonding pads facing up in prober 70. Probe array 50 is loaded or secured to test head 30 such that it can be positioned horizontally with probe pins facing down. Manipulator 20 may be used to position test head 30, signal delivery system 40, and probe array 50 to head plate 60 of prober 70. A prober provides alignment functionality by developing a positional relationship between the probe array and the bonding pads of the DUT. For example, a prober may incorporate two cameras, one operable to image the probe array and one operable to image the bonding pads of the DUT. Based on the image data collected, prober will align the probe array to the corresponding bonding pads. Once a first wafer has been aligned, probers usually have a step and repeat subsystem, which permits this process to be repeated for each DUT or group of DUTs. Exemplary prober systems and functionalities are described in U.S. Pat. Nos. 6,096,567 and 6,111,421, hereby incorporated by reference in their entirety.

In other wafer test cell configurations, the various wafer test cell components described above may be integrated into one another. FIG. 1 shows some of the components, or component functionalities, that may be integrated with one another as shaded. For example, some or all of the tester, test head, signal delivery system, and probe array functionality may be integrated into a single head complex 90. In practice, head complex 90 may be coupled to head plate 80 which may in turn be mounted on to prober 70. The V5400 system, designed and manufactured by Verigy Ltd., is an example of one such an integrated wafer test cell system although other wafer test cell components and configurations may be employed for testing wafers. Generally, wafer test cells may be viewed as incorporating (1) a prober, (2) probe array, and (3) tester electronics.

Also relevant is the inspection and testing of the equipment employed in the wafer test cell. Of particular interest is the inspection and analysis of probe array 50. Wafer test probe card inspection and analysis has conventionally been performed by one of several varieties of stand-alone wafer test probe card analysis systems. Examples of probe card inspection and analysis systems are embodied in the probeWoRx® 300/200 and PrecisionPoint VX probe card analysis systems, designed and manufactured by Applied Precision LLC, of Issaquah Wash.

FIG. 2 is a block illustration of an exemplary wafer test probe card inspection and analysis system. The generalized probe card inspection and analysis system 100 comprises a probe array analyzer module 110; a motherboard 120; and the probe array 50 to be tested. Motherboard 120 is a specialized system component that adopts or docks a specific purpose probe array 50 to the general-purpose probe array analyzer module 110. Motherboard 120 provides electrical contact between probe array 50 and the measurement electronics of probe card inspection and analysis system 100. The design of the motherboard is constrained by (1) the electrical and mechanical characteristics of conventional stand alone probe card inspection and analysis system and (2) the mechanical and electrical characteristics of the specific probe card being tested. In practice, motherboard 120 functions similarly to the signal delivery system 40 and/or test head 30 of wafer test cell 10, described above and illustrated in FIG. 1.

Probe array analyzer module 110 comprises a transposable stage or fiducial plate such as a planar conductive surface which may or may not be transparent or bare fiducial marks; a mechanical positioning components such as precision actuators; imaging components such as optical lenses and an illumination sources; imaging sensors such as a CCD or CMOS, electrical probe array test components, and a computer. The probe array analysis module 110 computer may operate through hardware and software components, such as drivers, frame grabbers, and image acquisition, analysis, and pattern matching software well known in the field. Generally speaking, the computer controls the overall operation of probe card inspection and analysis system 100. The computer may be viewed as functioning, in part, analogously to tester 80 of wafer test cell 10, described above and illustrated in FIG. 1.

Conventional probe card inspection and analysis systems determine probe needle locations in three-dimensional space and analyze the movement of needles under a programmable range of loaded and unloaded conditions. Several techniques known in the art such as, traditional lead screw or optical comparative metrology may be employed to determine probe pin locations. For example, probe pin locations may be determined by scanning the pins across a conductive and/or non-conductive transition on a stage as disclosed in U.S. Pat. Nos. 4,918,374, 5,508,629, and 5,831,443, which are hereby incorporated by reference in their entirety. Probe pin locations may also be determined by a combination of a precision motion stage and a video camera as described in U.S. Pat. No. 5,657,394, which is hereby incorporated by reference in its entirety. Alternatively, probe pin positions may be determined by utilizing a fiduciary plate having a plurality of fiduciary marks and a digital imaging device, as disclosed and claimed in U.S. Pat. No. 6,710,798, which is hereby incorporated by reference in its entirety.

Probe card inspection and analysis systems may also be operable to evaluate other probe card characteristics including, for example, probe card planarity, probe array planarity, probe card alignment, probe card pin alignment, electrical planarity, optical planarity, no-load planarity, loaded planarity, probe card/fixture deflection, leakage, wirechecker, probe force, and contact resistance. Probe card inspection and analysis systems may also be equipped with electrical signal generation and detection capabilities suitable to determine the functionality or characterize the performance of certain electronic components that may be incorporated into probe card circuit designs. Such components include voltage sources, voltage meters, current sources, current meters, multiplex electronics, relays, electronic buffers, MUX switches, electronic memory devices, communication circuitry and the like. Some probe card inspection and analysis systems may also incorporate probe card rework functionality.

Over the last decade, there has been a trend to increase the parallelism of wafer testing, particularly, for dynamic and flash memory testing. This allows devices with long test times to be processed more efficiently and thereby reduce cost. The current trend is to design and manufacture wafer test cell components such that a wafer is tested in a minimum number of touches, i.e. a probe array is brought into contact with a single wafer one time in order to facilitate testing of each DUT on the wafer.

As parallelism in wafer testing increases so does the complexity, size and weight of the previously described wafer test head components. For example, as parallelism increases so does the number of probe pins in the probe array. The increased number of pins necessitates the application of higher forces in order to contact the pins to the pads or bumps of the DUT. The use of higher forces in turn requires the implementation of more structurally rigid components, components with increased sizes and/or weights. These components generate interactions between the test head, probe card, and prober unique to a specific test cell. The conventional probe card inspection and analysis system is structurally limited in its ability to mimic or otherwise simulate these unique characteristics of a wafer test cell. As a result, the results obtained from a conventional probe card inspection and analysis system may be of increasingly limited value when used to troubleshoot problems in the increasingly complex probing process. What is needed in the field is an apparatus and method for the inspection and analysis of probe arrays under conditions that more closely correlate with the real-world conditions of the wafer test cell.

SUMMARY

The present disclosure provides an apparatus and method for the inspection and analysis of probe cards under wafer test cell conditions. Certain embodiments of the disclosure employ wafer test cell components that are either identical to or substantially similar to the physical attributes of the same components utilized in a real-world wafer test cell. These components are integrated into a system operable to perform wafer test probe card inspection and analysis. By integrating certain wafer test cell components into the probe card inspection and analysis process, evaluation of probe card performance characterizes may more accurately reflect real-world test cell conditions.

BRIEF DESCRIPTION OF THE DRAWINGS

FIG. 3 is a functional block diagrams illustrating an example of a probe array inspection and analysis system incorporating various components and/or characteristics of a conventional wafer test cell.

FIGS. 4A and 4B are functional block diagrams illustrating a system configuration in which a wafer test process and a probe array inspection and analysis process share specific wafer test cell components.

DETAILED DESCRIPTION

Embodiments of the present disclosure will now be described in detail with reference to the drawings, which are provided as illustrative examples so as to enable those skilled in the art to practice the disclosure. Notably, the figures and examples below are not meant to limit the scope of the present disclosure to a single embodiment, but other embodiments are possible by way of interchange of some or all of the described or illustrated elements. Where certain elements of these embodiments can be partially or fully implemented using known components, only those portions of such known components that are necessary for an understanding of the present disclosure will be described, and detailed descriptions of other portions of such known components will be omitted so as not to obscure the disclosure. In the present specification, an embodiment showing a singular component should not be considered limiting; rather, the disclosure is intended to encompass other embodiments including a plurality of the same component, and vice-versa, unless explicitly stated otherwise herein. Moreover, it is not intended that any term in the specification or claims be ascribed an uncommon or special meaning unless explicitly set forth as such. Further, the present disclosure encompasses present and future known equivalents to the components referred to herein by way of illustration.

The present disclosure provides systems and methods for the inspection and analysis of probe arrays used in semiconductor test equipment (hereinafter referred to as a semiconductor test cell or wafer test cell). In certain embodiments, the systems and methods are concerned with the inspection and analysis of probe arrays under real-world wafer test cell conditions. In contrast to conventional probe card analysis systems and their reliance on a motherboard for interacting with the probe array, the present disclosure can directly interface conventional probe card inspection and analysis functionality with wafer test cell system components. Systems and methods according to certain aspects of the disclosure employ probe array inspection functionality in a structure analogous or identical to the structure of a wafer test cell prober. Probe array analysis functionality may also be employed in a structure analogous or identical to that of a prober and may further be employed in other wafer test cell or test cell-like components. Direct utilization of wafer test cell components that, in combination, affect a probe array performance during the probing process—for example, signal delivery system, test head or interface unit, and/or head complex—may yield improved probe array analyses over that of a conventional probe card inspection and analysis system. These improved analyses can more accurately reflect the complex conditions of a real-world wafer test cell.

Figure 1:
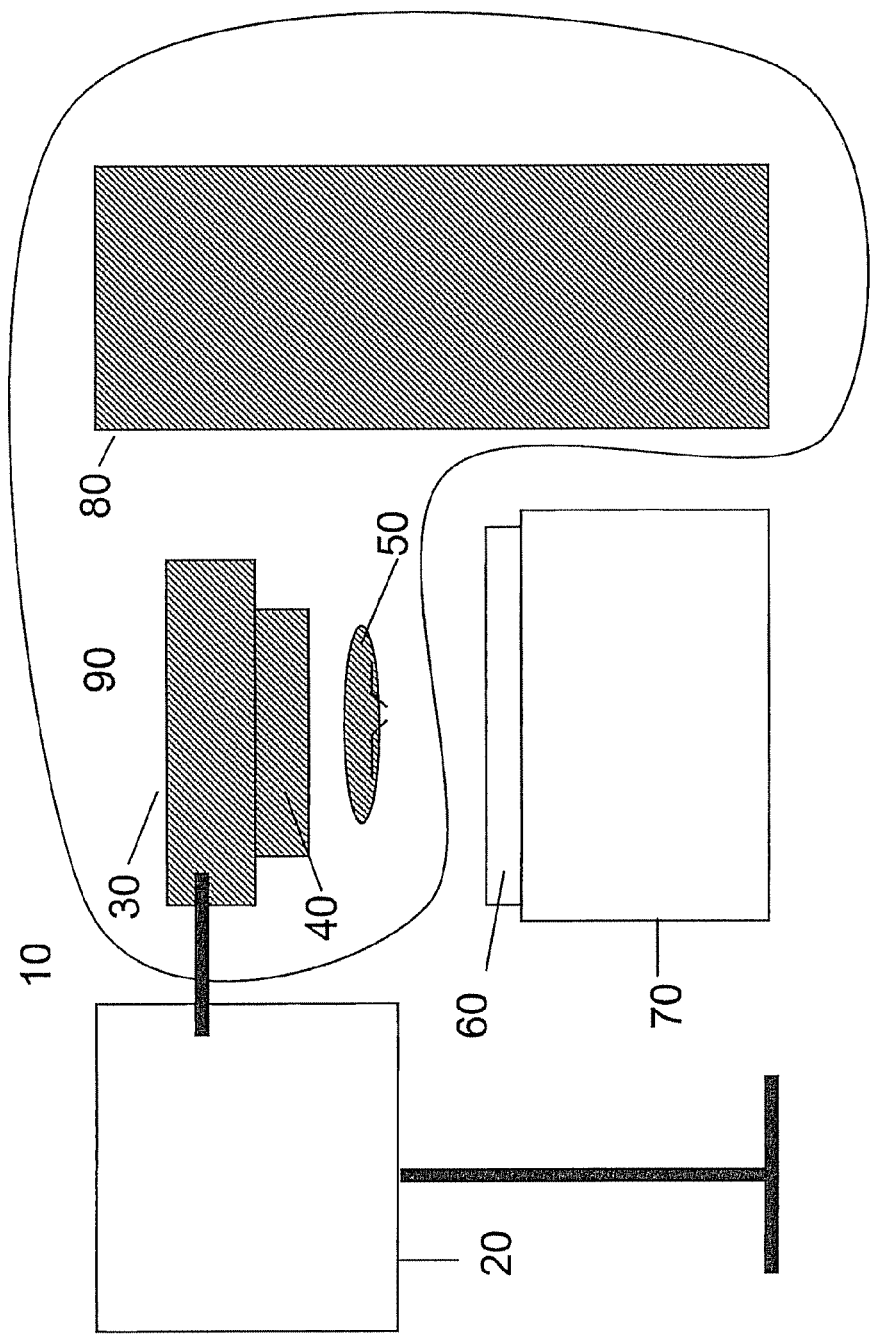
FIG. 1 is a functional block diagrams illustrating a conventional wafer test cell.
Figure 2:
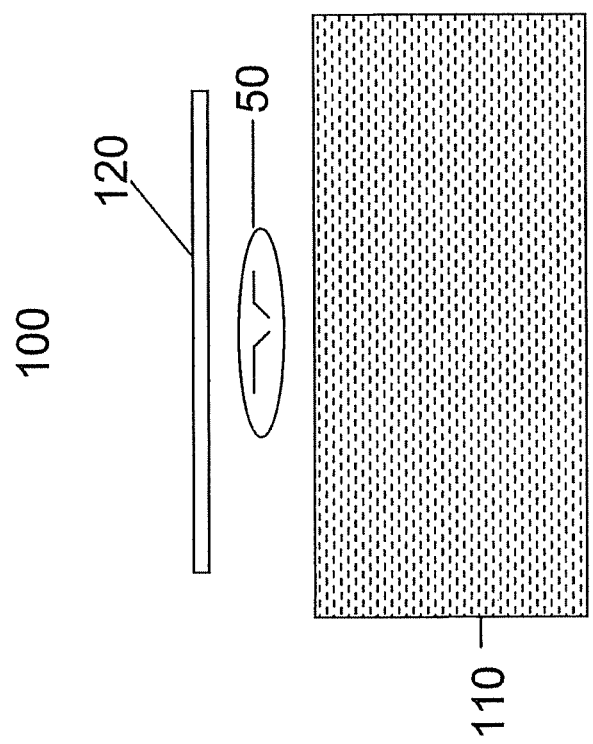
FIG. 2 is a functional block diagrams illustrating a conventional probe card inspection and analysis system.

Certain embodiments of the present disclosure use at least some features of the relevant wafer test cell components for the purpose of probe array inspection and analysis as required or desired. In particular, in certain embodiments, only the structural aspects or physical characteristics of the relevant wafer test cell components are maintained in the inspection and analysis equipment. For example, and with reference to FIG. 1, the present disclosure may employ only the outer structure, docking hardware, and/or weight and balance characteristics of the wafer test cell component or components employing the functionality of signal delivery system 40, test head 30, tester 80 and/or head complex 90 utilized in the relevant wafer test cell. Certain functionality of the relevant wafer test components may be deleted or replaced with probe array inspection and analysis specific mechanical, electrical, and software components. For example, probe array inspection and analysis electronics, such as application specific printed circuit board, may be designed to match the footprint and connectivity of the wafer test cell component's wafer test electrics. Adaptation of relevant wafer test cell components for use in probe array inspection and analysis systems employing certain embodiments of the present disclosure may therefore be streamlined by a simple replacement of wafer test cell component electronics.

With reference to FIG. 3, in certain embodiments, a wafer test probe array analysis system 200 may comprise combinations of head plate 260, signal delivery system 240, test head or interface unit 230, manipulator 220, head complex 290 and probe array analyzer module 210. Manipulator 220 may be utilized to support, transpose, and dock test head unit 230, signal delivery system 240, and probe array 50, or head complex 290. In addition, manipulator 220 is typically configured to perform conventional wafer test functionalities with various makes and models of test heads or interface units. Similarly, test head 240 may be operable to dock or otherwise mount various makes, models and types of signal delivery systems and probe arrays including, but not limited to, vertical, Cobra, cantilever, membrane, and microspring probe arrays. When probe array 50, signal delivery system 240, test head 230 have been operably joined, manipulator 220 may transpose and dock the components with head plate 260. Manipulator 220 may also be configured to transpose and dock head complex 290 with head plate 260. Head plate 260 may be mounted, attached, or otherwise coupled to probe array analyzer module 210. After the components are aligned and docked with head plate 260, the relevant wafer test cell or test cell-like components can be assembled on to probe array analysis module 210 and probe array inspection and analysis may ensue.

In certain embodiments, selected wafer test cell components can be modified or otherwise enhanced to facilitate performance of probe array inspection and analysis functions in addition to conventional wafer test cell functionality. For example, the functionality of a conventional manipulator 20, test head 30, signal interface 40, prober 70 and/or tester 80 of FIG. 1 can be modified or enhanced in accordance with aspects of the disclosure such that these modified components can perform the desired probe array inspection and analysis functions. The probe array inspection and analysis process may be conducted, in whole or in part, by actual wafer test cell components.

Figure 4B:
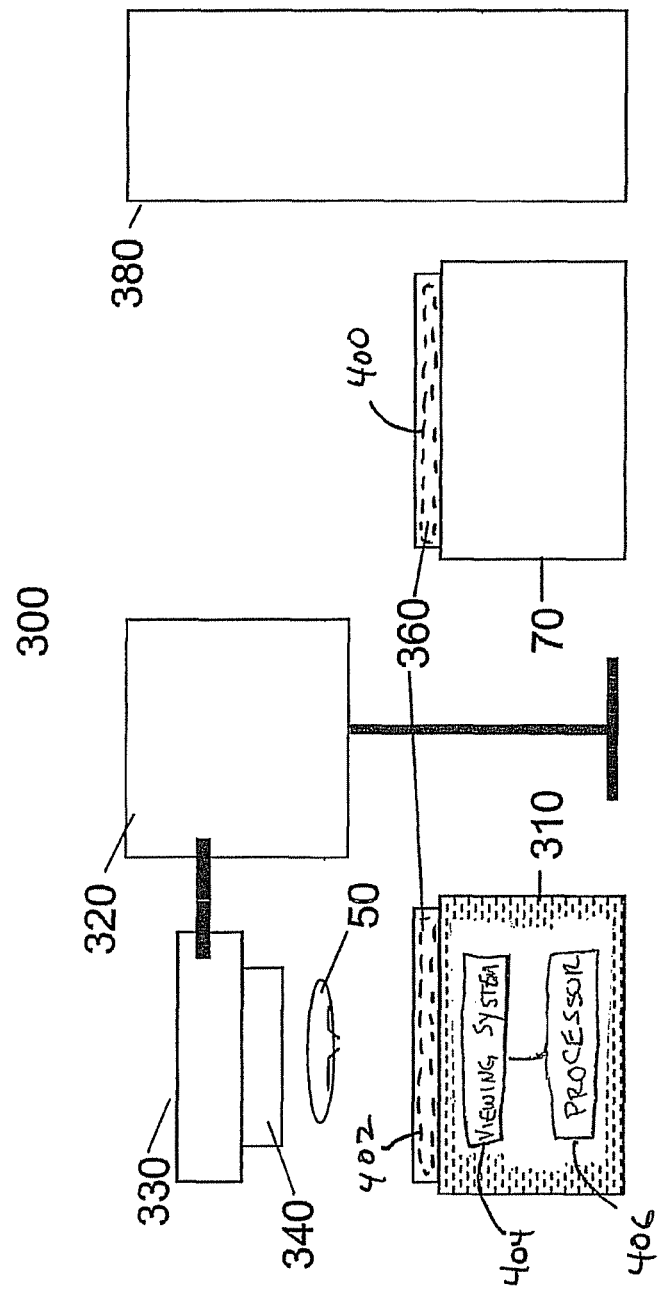

As illustrated in FIGS. 4A and 4B, probe array analyzer module 310 may be situated proximate to the wafer test cell. Manipulator 320 can be used to transpose and support test head 330, signal delivery system 340, and probe array 50 for docking to head plate 360 situated on probe array analyzer module 310. In certain embodiments, the probe array inspection and analysis process may be controlled or conducted solely by probe array analyzer module 310, by tester 380, or by a combination of the two components. Prober 70 and head complex, such as that described above as head complex 90, may employed in this embodiment substantially as described above. In certain embodiments, the system configuration avoids the necessity of creating a duplicate wafer test cell components for use in the probe array inspection and analysis process.

In certain embodiments of the present disclosure, the entire probe array inspection and analysis process can be provided as improvements or additions to the components of an existing wafer test cell. For example, prober 70, described above and illustrated in FIG. 1, may be enhanced to incorporate probe array inspection and or analysis hardware such as those disclosed in the above referenced patents and applications relating to conventional probe card inspection and analysis systems and methods. More particularly, prober 70 may employ lead screw or optical comparative metrology techniques to inspect probe arrays. In another example, tester 80 (see FIG. 1) may be modified to perform the analysis functionality previously performed by the computer of the probe card inspection and analysis system.

In one particular embodiment illustrated in FIGS. 4A and 4B, head plate 360 coupled to prober 70 includes a stage 400 for supporting probe array 50. Furthermore, head plate 360 coupled to probe array analyzer module 310 includes a transparent fiducial plate 402. Probe array analyzer module 310 includes a viewing system 404 and processor 406 coupled to viewing system 404 to image probe array 50 and fiducial plate 402. Processor 406 can be configured to process images from viewing system 404 to identify positions of probes on the probe array 50.

Certain embodiments of the present disclosure enable use of standard wafer test cell probe card handling and loading capabilities. Probe card handling and loading components are commonly recognized and understood in the field.

Certain other embodiments of the present disclosure provide a signal connection pathway, for example a high frequency signal connection path, between some or all of the following components: probe array, signal delivery system, test head, tester, probe array analyzer module and prober.

It will be appreciated that probe array inspection and analysis system according to certain aspects of the present disclosure will comprise tester, test head, and/or test complex specific probe array inspection and analysis systems. For example, a probe array inspection and analysis system may be augmented such that the system can inspect and analyze only those probe arrays specifically designed to function with the wafer test cell components. Augmentation may include utilizing, integrating, or otherwise incorporating specific application wafer test cell components into a probe array inspection and analysis system.

The probe array analysis functionality of certain embodiments of the present disclosure may include all of the probe card analysis functionality previously described including but not limited to: the functionality of the probeWorx and PrecisionPoint probe card analysis systems, and analysis of probe card planarity, probe array planarity, probe card alignment, probe card pin alignment, electrical planarity, optical planarity, no-load planarity, loaded planarity, probe card/fixture deflection, leakage, wirechecker, probe force, contact resistance, resistor, capacitance, capacitor. Probe card analysis systems may also incorporate probe card rework operability.

Certain embodiments of the disclosure exhibit a high degree of accuracy in measurement. Furthermore, certain embodiments offer additional applications of the inspection data obtained. For example, in aligning a probe array to a wafer, a conventional prober may determine the planarity of the probe array with respect to the wafer, as well as the XY position of select probe pins and bonding pads. It will be appreciated that conventional prober performs these analyses merely to the degree necessary to align the probe pins to the bonding pads of the DUT.

In contrast, probe card inspection and analysis systems augmented according to certain aspects of the disclosure and other embodiments of the present disclosure can perform probe array and probe pin inspection at a significantly higher degree of accuracy and speed over conventional systems. A further advantage obtained from certain embodiments of the disclosure is the broader range of testing and measurement capacity available to a user or operator. Furthermore, a broader range of applications can be provided for data obtained including determination of performance characteristics of a probe array in addition to information related to the alignment of the probe array to a wafer.

Additionally, as a result of the wafer probing process, wafer probe marks, or scrub marks, may be made upon the surface of a probed wafer or test wafer as described in U.S. patent application Ser. No. 11/479,822, which is hereby incorporated herein by reference. Inspection and analysis of wafer probe marks may yield valuable data relating to performance and characteristics of a probe card, as well as performance and characteristics of an entire semiconductor test process. Certain embodiment of the present disclosure may also be used to scrub a wafer or test wafer and to inspect and analyze wafer probe marks. For example, probe array analyzer module 210 or 310, or a modified prober 50 may be configured to load a wafer or test wafer onto a transposable stage substantially identical to the stage present in a wafer probe mark analyzer or wafer prober. The wafer may then be scrubbed and the resulting scrub marks inspected and analyzed. Inspection and analysis may include the position, orientation, and size of certain probe marks, as well as certain probe mark to bonding pad and bonding pad to bonding pad characteristics.

Additional Descriptions of Certain Aspects of the Disclosure

Certain embodiments of the disclosure provide systems comprising a probe array and a probe array analyzer module operably coupled to one or more components derived from a semiconductor test cell, whereby the probe array analyzer is for analyzing the probe array under normal operational conditions of the semiconductor test cell. In some of these embodiments, the one or more components include at least one of a head plate, a test head and a head complex. In some of these embodiments, the one or more components include a signal delivery system. In some of these embodiments, the head plate is proportioned in accordance with a wafer test cell head plate employed in the semiconductor test cell. In some of these embodiments, the test head is substantially similar in physical characteristics to a wafer test cell test head employed in the semiconductor test cell. In some of these embodiments, the test head includes probe array inspection and analysis electrical components in place of selected semiconductor test cell electrical components. In some of these embodiments, the signal delivery system is constructed in accordance with the structure of a wafer test cell signal delivery system employed in the semiconductor test cell. In some of these embodiments, the head complex is constructed in accordance with the structure of a wafer test cell head complex employed in the semiconductor test cell. In some of these embodiments, the test complex includes probe array inspection and analysis electrical components in place of selected semiconductor test cell electrical components. Some of these embodiments further comprise a manipulator. In some of these embodiments, the system is operable to analyze the performance characteristics of the probe array under physical conditions substantially similar to the semiconductor test cell. In some of these embodiments, the probe array analyzer module further comprises a wafer test cell prober. Some of these embodiments further comprise a wafer probing process analyzer. In some of these embodiments, the wafer probing process analyzer is operable to inspect and analyze wafer probe marks.

Certain embodiments of the disclosure provide methods for inspecting and analyzing wafer test probe arrays where the methods comprise mounting a probe array to one or more components derived from a semiconductor test cell, the one or more components including at least one of a head plate, a test head and a head complex, inspecting the probe array, and determining performance characteristics of the probe array based on the inspecting, wherein the one or more derived components facilitate the inspecting under normal operational conditions of the probe array. In some of these embodiments, the head plate is proportioned in accordance with a wafer test cell head plate employed in the semiconductor test cell. In some of these embodiments, the test head is substantially similar in physical characteristics to a wafer test cell test head employed in the semiconductor test cell. In some of these embodiments, the test head includes probe array inspection and analysis electrical components in place of selected semiconductor test cell electrical components. In some of these embodiments, the one or more components include a signal delivery system constructed in accordance with the structure of a wafer test cell signal delivery system employed in the semiconductor test cell. In some of these embodiments, the head complex is constructed in accordance with the structure of a wafer test cell head complex employed in the semiconductor test cell. In some of these embodiments, the test complex includes probe array inspection and analysis electrical components in place of selected semiconductor test cell electrical components. In some of these embodiments, the inspecting is performed using a prober. In some of these embodiments, the head plate is coupled to a probe array analyzer module. Some of these embodiments further comprise the step of generating wafer probe marks. Some of these embodiments further comprise the step of analyzing wafer probe marks. Some of these embodiments further comprise the step of performing a wafer test.

Certain embodiments of the disclosure provide a wafer test probe array inspection and analysis system comprising a probe array analyzer operably coupled to coupled to one or more components derived from a semiconductor test cell, wherein the probe array analyzer is for analyzing a probe array under normal operational conditions of the semiconductor test cell and wherein the one or more components includes a head plate, a test head and a head complex. Some of these embodiments further comprise a manipulator. In some of these embodiments, the probe array analyzer is operable to perform wafer test cell probing. In some of these embodiments, the system is operable to analyze certain performance characteristics of a wafer test probe array under conditions substantially similar to the operating physical conditions of the semiconductor test cell. Some of these embodiments further comprise a wafer probing process analyzer. In some of these embodiments, the wafer probing process analyzer is operable to inspect and analyze wafer probe marks. In some of these embodiments, the one or more components cooperate to perform wafer tests.

Certain embodiments of the disclosure provide a method for emulating the characteristics of a wafer test cell while inspecting and analyzing a probe array employed in the test cell, method comprising docking a probe array analyzer module with a wafer test cell, inspecting the probe array and evaluating performance characteristics of the probe card based on the inspecting. In some of these embodiments, the wafer test cell comprises one or more components derived from a semiconductor test cell, the one or more components including a head plate, a test head, a signal delivery system and a head complex. In some of these embodiments, the structures of the one or more components correlate to structures of corresponding components in a wafer test cell. In some of these embodiments, the probe array analyzer module is interfaced with a prober. Some of these embodiments further comprise the step of performing a wafer test. Some of these embodiments further comprise the step of analyzing a wafer probing process. Some of these embodiments further comprise the step of generating scrub marks on a wafer.

In order to emulate the characteristics of a wafer test cell while inspecting and analyzing a probe array, it can be important to understand forces present in both the wafer test cell and corresponding probe array analyzer module. When these forces are calculated, a wafer test cell can be emulated with enhanced accuracy such that a probe card can be inspected under the forces that will be experienced during semiconductor wafer testing. FIGS. 5-9 below discuss measuring and mitigating these forces in a probe analyzer module, otherwise also referred to as a probe card analyzer system.

Figure 5:
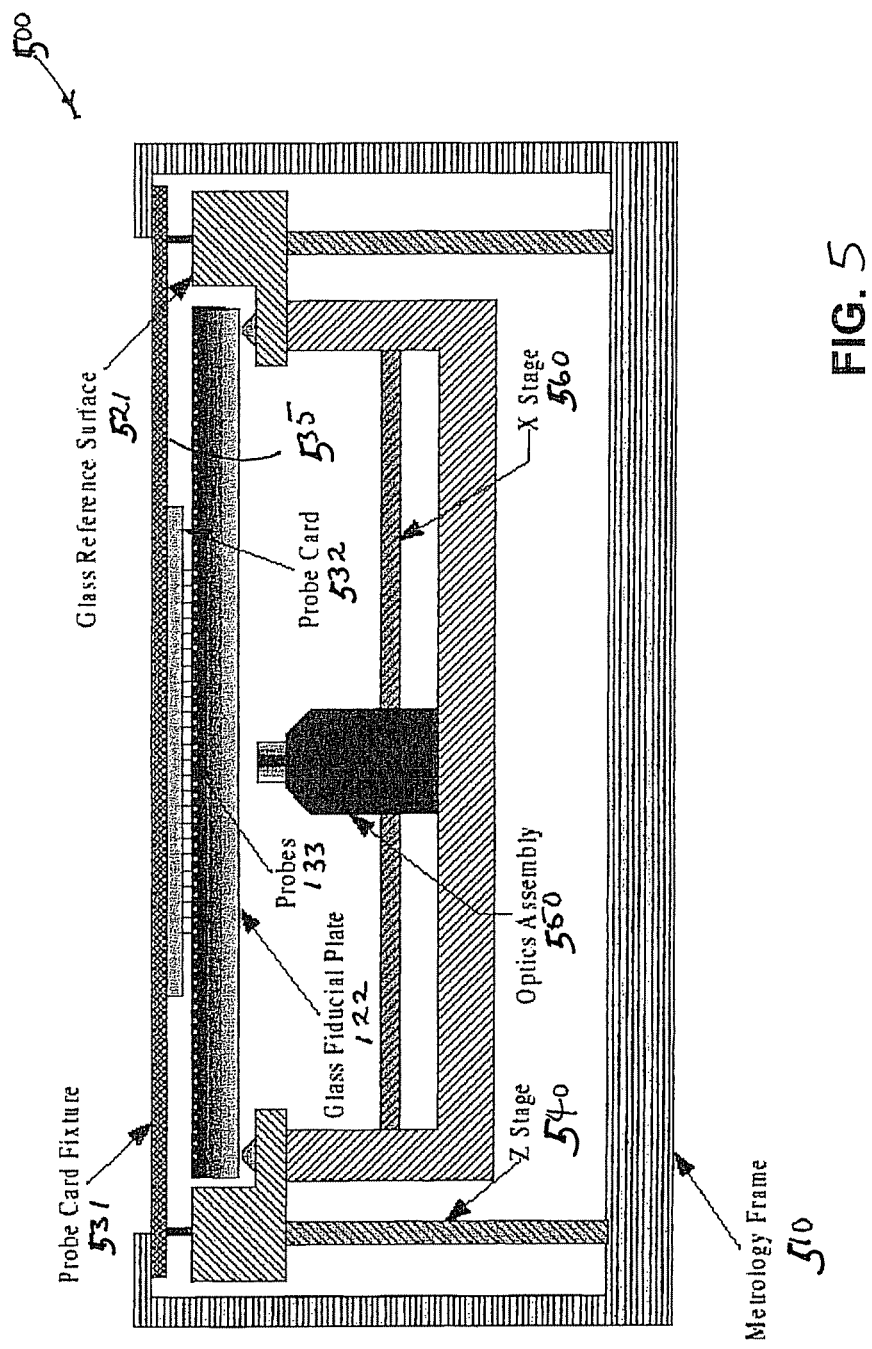
FIG. 5 is a simplified block diagram illustrating components of one embodiment of a probe card analyzer system.

FIG. 5 is a simplified block diagram illustrating components of one embodiment of a probe card analyzer system. As is generally known in the art, system 500 may comprise a metrology frame 510 to which other components are mounted. Specifically, exemplary system 500 generally comprises a plate reference surface 521 configured and operative to carry or otherwise to support a substantially transparent fiducial plate 522, a probe card 532 attached to or otherwise supported by a probe card fixture 531, and a z-stage 540 configured and operative to provide relative movement (along an axis, z, e.g., vertically in FIG. 1) between fiducial plate 522 and probe card 532. In some embodiments, one or more sensors, such as z-sensor 541, for example, may measure the relative distance between probe card fixture 531 and plate reference surface 521.

Typically, fiducial plate 522, in addition to being substantially transparent as set forth in more detail below, is also electrically conductive to enable electrical planarity measurements.

Optics assembly 550 may be employed to acquire image data (e.g., visual or optical data) of one or more probes 533 through substantially transparent fiducial plate 522. Accordingly, the term "substantially transparent" as used herein generally refers to the quality of allowing transmission of sufficient energy in at least a portion of the electromagnetic spectrum, such as the visible wavelengths of the spectrum, for example, to allow optics assembly 550 to acquire such images or optical data through fiducial plate 522. It will be appreciated that various factors may affect characterization of a particular fiducial plate 522 as "substantially transparent" in this context. For example, "substantial" transparency may be affected or influenced by some or all of the following, among other factors: transmission properties and attenuation properties (such as the refractive index, the presence and density of any occlusions, etc.) of the material used to construct fiducial plate 522; the thickness of fiducial plate 522 along the optical axis of optics assembly 550; the type (frequency and amplitude, for example) of energy impinging upon or passing through fiducial plate 522; the capabilities and sensitivity of optics or imaging hardware employed at optics assembly 550; and the like. In some embodiments, fiducial plate 522 may be constructed of glass, acrylic, quartz, or a similar material substantially transparent to electromagnetic energy in a predetermined or desired portion of the spectrum.

It will be appreciated that system 500 may also comprise various motors, actuators, positional sensors, and the like (not shown in FIG. 5) configured and generally operative to control relative positioning and orientation of the various components such as z-stage 540, x-stage 560, y-stage (not shown), optics assembly 550, fiducial plate 522, and probe card 532. For example, the operational focal length of optical equipment, lens arrangements, sensors (such as a charge-coupled device (CCD) or complementary metal-oxide semiconductor (CMOS) detector), or other imaging hardware utilized at optics assembly 550 may affect the optimum or desired distance (in the z dimension) between optics assembly 550 and fiducial plate 522. Similarly, selective positioning of optics assembly 550 relative to fiducial plate 522, probe card 532, or both, in either or both of the x and y directions may be required or desired. In many applications, precise three-dimensional positioning and orientation of the various components may be influenced or controlled by one or more computers, micro-controllers, programmable logic controllers, or other electronic or electromechanical components such as stepper motors, worm gears, precision actuators, and the like. Numerous hardware and software configurations suitable for this purpose are generally known in the art, and are susceptible of many variations and modifications. The present disclosure is not intended to be limited by any particular combination of hardware elements and software modules operative selectively to manipulate the components of system 500 in three-dimensional space.

Additionally, various components illustrated in the exemplary FIG. 5 embodiment may be coupled to one or more computers or other processing components. Specifically, a data processing component comprising hardware and software may be configured and operative to receive acquired image data and to compute planarity, for example, or to perform other operations. Such a data processing component may additionally be operative to command or request movement or rotation of various system components to correct for deflections as set forth in more detail below. The present disclosure is not intended to be limited by any particular data processing hardware or software implementation, control electronics, feedback mechanisms, and the like.

As is generally known in the art, one factor underlying the superior speed and efficiency of optical planarity analyses over electrical planarity analytical methodologies is the rapidity and efficiency with which the planarity of bussed probes can be measured using the optical technology.

In some embodiments, a system and method constructed and operative in accordance with the present disclosure combine non-bussed electrical planarity measurements with fast optical planarity measurements to produce "effectively loaded" planarity measurements. Specifically, aspects of the present invention are related to acquiring fast measurements of planarity that incorporate the effects of deflection under load that are present in typical electrical planarity measurements. Furthermore, exemplary approaches as outlined herein also produce useful measurements of the combined deflection under load of probe card 532 and probe card fixture 531.

As contemplated herein, and further by way of background, the following terminology will be used to describe various methods for measuring planarity: "electrical planarity" generally refers to electrical planarity measurements of non-bussed probes acquired in a loaded condition (i.e., under contact load); "optical planarity" or "unloaded planarity" generally refer to optical planarity measurements of all probes acquired in a no-load condition (i.e., under no contact load); and "loaded planarity" generally refers to hybrid planarity measurements of all probes acquired under load; in this context, load planarity measurements may be derived from a combination of fast optical and fast non-bussed electrical planarity measurements. These measurements generally may incorporate the effects of deflection under load, and hence may be related to or correlated with "electrical planarity" measurements.

In order to calculate loaded planarity, a determination may first be made of the magnitude of deflections or flexures associated with various system components; as set forth in general above, these deflections or flexures may occur during the measurement of electrical planarity when one or more probes are subjected to loading as a result of an overtravel condition. Specifically, such deflections may include some or all of the following, without limitation: deflection of z-stage 540; deflection of fiducial plate 522; and deflection of probe card 532, fixture 531, or both.

Stage Deflection Measurement Effects

As set forth above, electrical planarity is conventionally measured by slowly moving, or "overtraveling," a reference surface (such as plate reference surface 521) relative to a reference surface 535 associated with probe card fixture 531. In the case of a probe card analyzer (such as indicated by reference numeral 500 in FIG. 5) that measures planarity optically via comparative metrology, an appropriate reference surface is typically plate reference surface 521. Planarity for probe card 532 may be recorded as the location of z-stage 540 (along the z-axis) relative to plate reference surface 521 at the point where the lowest probe 533 first makes electrical contact with fiducial plate 522. This stage location (in the z dimension) generally is considered to represent the location of plate reference surface 521 relative to reference surface 135 of probe card fixture 531.

Figure 6:
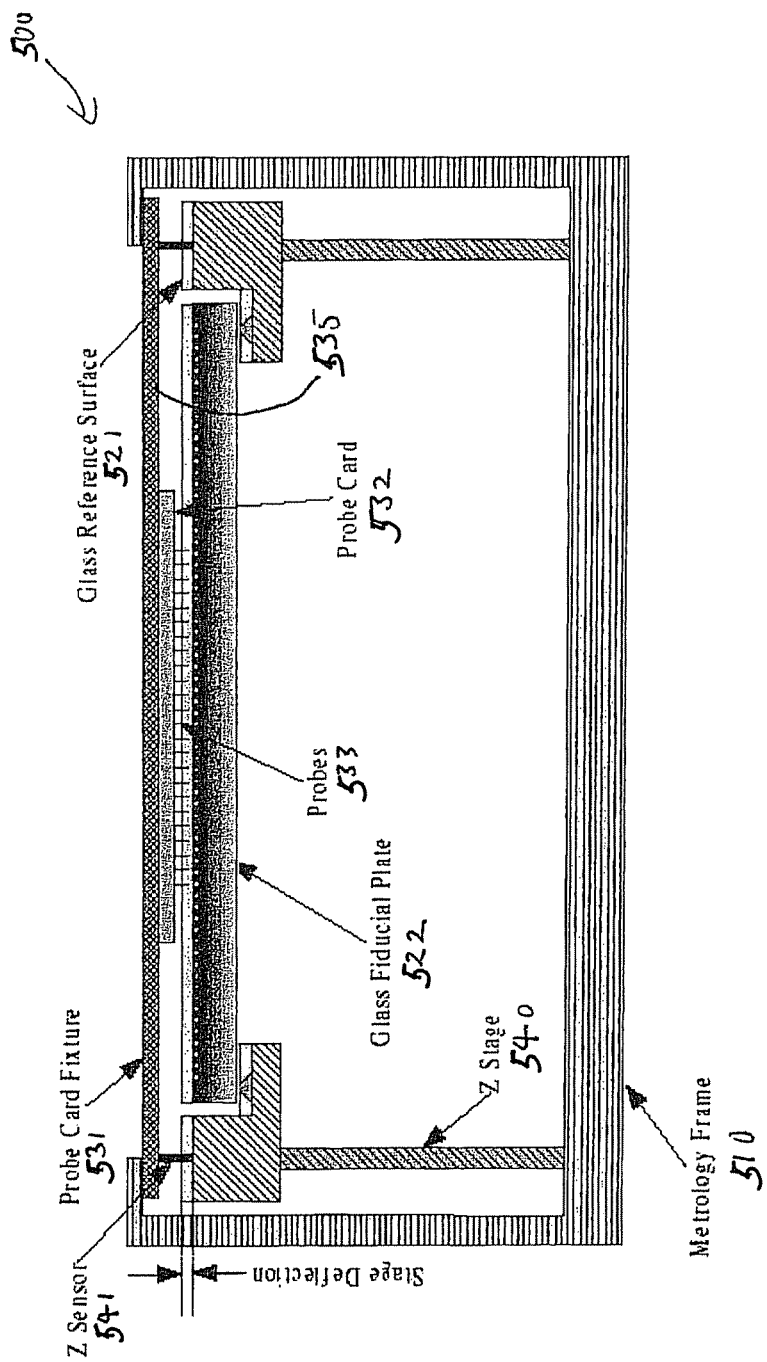
FIG. 6 is a simplified block diagram illustrating exemplary z-stage deflection under contact loading due to overtravel.

FIG. 6 is a simplified block diagram illustrating exemplary z-stage deflection under contact loading due to overtravel. As illustrated in FIG. 6, a problem may arise as loads develop during overtravel. Specifically, z-stage 540 may tend to deflect in the z direction, flex about one or more axes, or otherwise to deform relative to reference surface 535 of fixture 531 due to structural compliance; additionally or alternatively, as addressed below, flexure or other deformation may occur in fixture 531, probe card 532, or both due to the same forces exerted by the contact loading on probes 533. By way of example, the left side of FIG. 5 illustrates a deflection of plate reference surface 521 relative to reference surface 535 of probe card fixture 531. If a base-line or tare z-position of stage 540 that is used to infer planarity is taken from a remote measurement that neither observes nor accounts for such deflection effects (e.g., a measurement acquired from a motor shaft encoder near the base of metrology frame 510), error may be introduced into the planarity measurement.

One exemplary mechanism which may effectively eliminate the foregoing error employs a direct measurement acquired as close as possible to plate reference surface 521 and reference surface 535 associated with probe card fixture 531. In that regard, the FIG. 6 embodiment is illustrated as employing a direct measurement sensor (z-sensor 541) appropriately disposed proximate both plate reference surface 521 and reference surface 535 associated with probe card fixture 531. Electrical planarity measurements based upon, or taking into account, these proximal sensor measurements may significantly reduce errors induced by deflection of stage 540. Moreover, mechanisms can be employed to place forces on fiducial plate 522 and/or probe card 532 that closely resemble a wafer test cell.

Fiducial Surface Deflection

Under load from probes 533 which have been overtraveled, fiducial plate 522 may deflect, flex, warp, or otherwise deform. Such deflection typically has two primary components: rigid body deflection of fiducial plate 522 due to compliance at its supports; and bending deflection due to compliance of fiducial plate 522 itself. Such deflection may result in reduced, and potentially non-uniform, overtravel of one or more probes 533 over the probe array. In that regard, FIG. 5 is a simplified block diagram illustrating exemplary fiducial plate deflection under contact loading due to overtravel.

In accordance with the exemplary embodiment, a system and method as set forth herein may accurately measure the amount of deflection that has occurred in the area of fiducial plate 522 that actually contacts the array of probes 533; accordingly, commanded overtravel may be compensated to nullify or to mitigate undesirable effects of the quantified deflection. Specifically, net resultant overtravel may closely approximate desired overtravel. It will be appreciated that the only portion of deflection remaining uncompensated may be deflection of fiducial plate 522 within the area actually making contact with the array of probes 533. In practice, this component of deflection is much less significant than the other deflection components that are identified, and may thus be considered negligible.

As set forth above, the exemplary optical metrology techniques described herein are generally three-dimensional comparative metrology analyses employing or comprising stereoscopic imaging processes and a substantially transparent fiducial plate 522. In addition to measuring probe planarity and alignment, these optical analytical methodologies may also be capable of measuring deflection of fiducial plate 522 relative to optics assembly 550.

Figure 7:
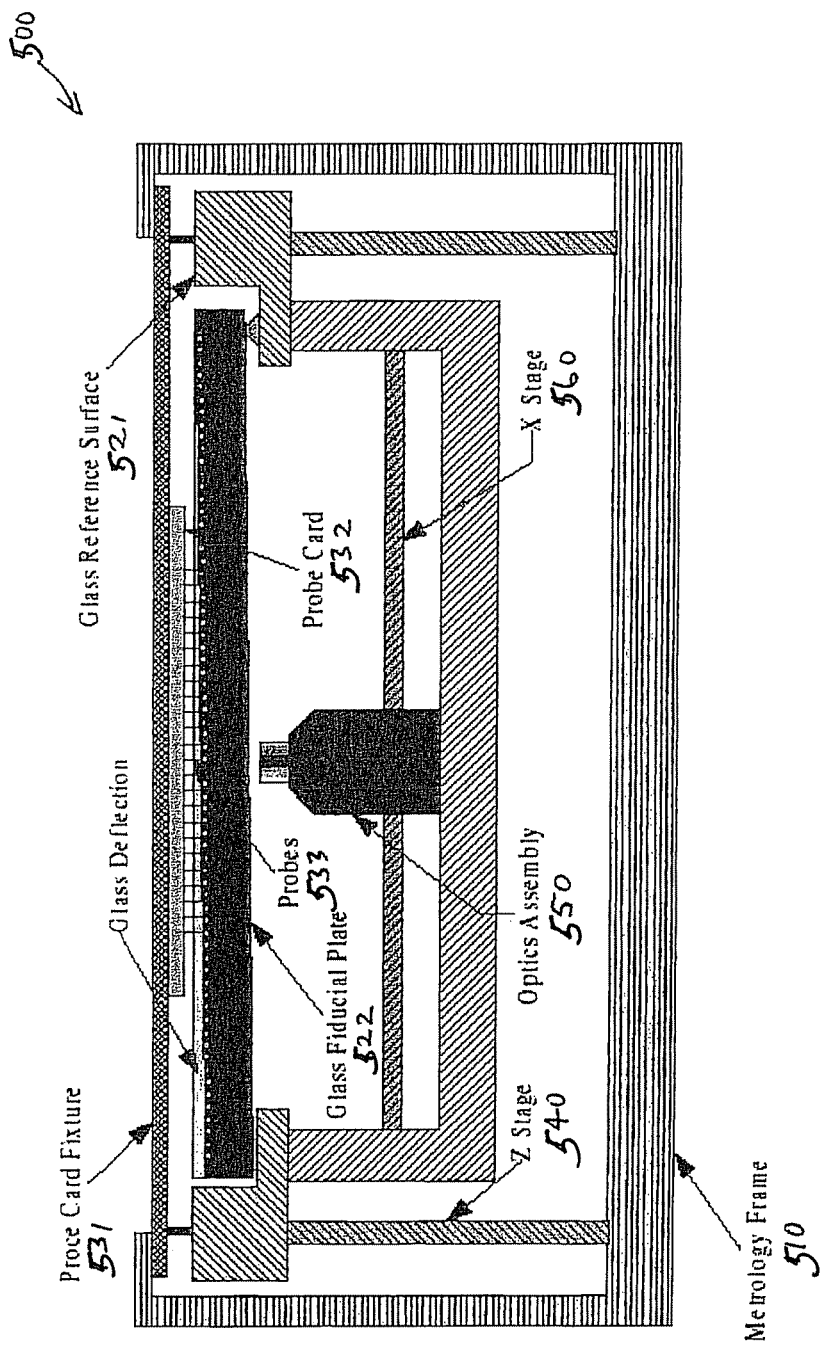
FIG. 7 is a simplified block diagram illustrating exemplary fiducial plate deflection under contact loading due to overtravel.

FIG. 7 is a simplified block diagram illustrating one embodiment of a technique for measuring fiducial plate deflection. In one imaging operation, a fiducial grid network disposed on, or incorporated in the structure of, fiducial plate 522 may be imaged from two perspectives. This imaging operation may result in acquisition of visual or other image data of the fiducial grid in a no-load situation, i.e., fiducial plate 522 is not under loading for purposes of this imaging process. The position of the fiducial array (in a no-load condition) may be measured from each imaging perspective.

In another imaging operation, a load (such as may be expected during overtravel in a probe analysis application, for example) may be applied to fiducial plate 522; as set forth above, fiducial plate 522 may deflect under such a load. The fiducial grid network may then be imaged, again from two perspectives. In some applications, including the exemplary embodiment illustrated in FIG. 7, these perspectives may correspond to those employed in the no-load imaging process; alternatively, in some more sophisticated imaging techniques, one or both perspectives may differ from the perspectives used for the no-load imaging process. Based upon this loaded imaging operation (i.e., acquisition of visual or other image data), measurements may then be taken of the grid structure (in the loaded condition) from each imaging perspective.

Figure 8:
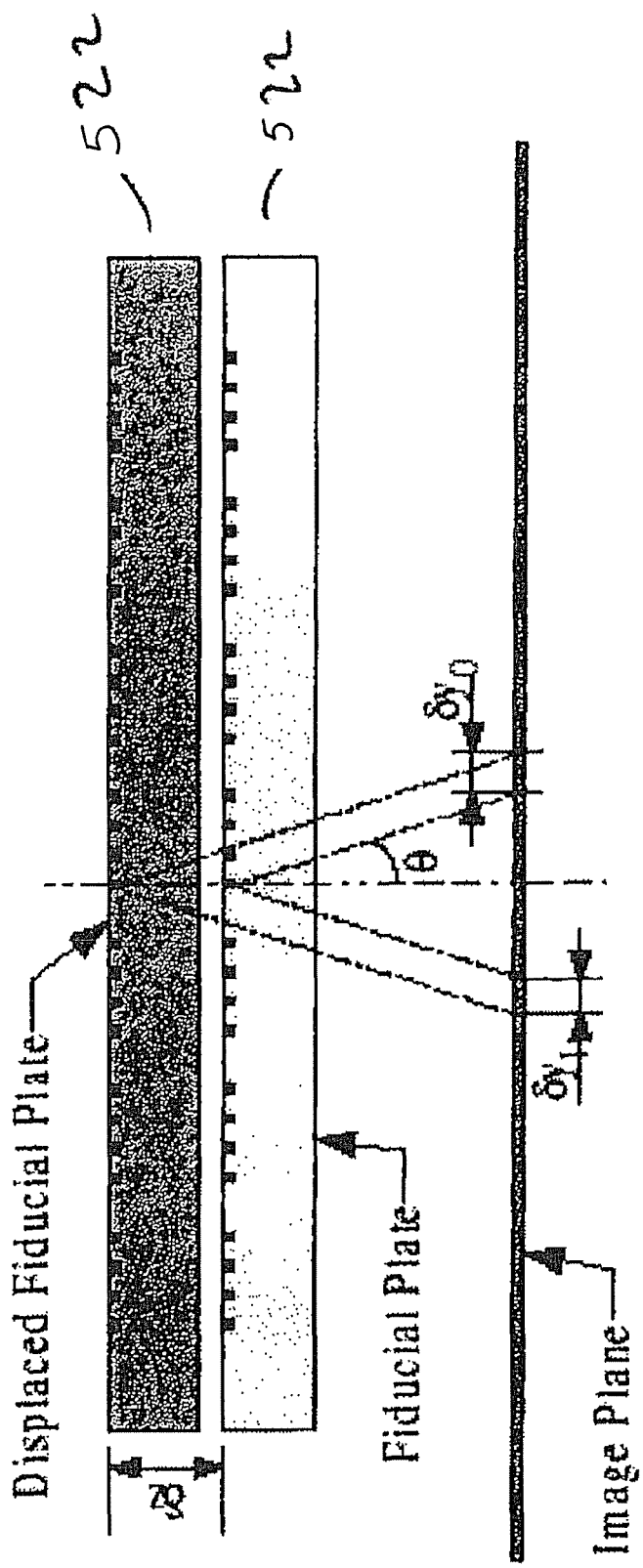
FIG. 8 is a simplified block diagram illustrating one embodiment of a technique for measuring fiducial plate deflection.

It will be appreciated that the order in which the foregoing imaging operations are conducted may not be important, or may be of only tangential importance; in some applications, either the loaded or the no-load condition may be imaged first. In some exemplary embodiments, the imaging processes may be iterated or alternated one or more times to prevent calibration errors or to mitigate the effects thereof. As illustrated in FIG. 8, fiducial plate 522 is deflected a distance, $\delta_z$. Changes in apparent location (e.g., in the loaded condition) of one or more elements of the fiducial grid relative to the original location (e.g., in the no-load condition) may be expressed as $\delta_{yo}$ and $\delta_{y1}$, for each respective perspective. This geometry is depicted in FIG. 8, where the z axis is vertical and the y axis is horizontal in the plane of the figure. The viewing angle of optics assembly 550 off normal from each perspective is defined by the angle $\theta$.

Given the geometry in FIG. 8, it is possible to compute the deflection in fiducial plate 522 relative to the no-load condition via Equation (1):

$$\delta_z = (\delta_{yo} + \delta_{y1})/2 \tan \theta \quad (1)$$

Individual deflections may be mapped over the area of fiducial plate 522 that is in contact with probes 533 to produce a set of measurements representing a number, n, of deflections over the contact area, as set forth below in Equation (2)

$$p_{1i} = (x_i, y_i, \delta_{g1i})(i=1,2,\ldots,n) \quad (2)$$

where $x_i$ and $y_i$ are the x and y locations of the deflection measurement, and $\delta_{g1i}$ is the measured deflection (in the z direction) in fiducial plate 522. It is noted that the x axis is normal to the plane of FIG. 8.

Individual points, $p_{1i}$, may be fit to a best-fit plane by various methods such as a linear least squares technique, for example, or some other suitable statistical methodology. From the plane fit, all of the following physical characteristics fiducial plate 522 may be extracted: the deflection at the center ($\delta_{g1center}$); the pitch angle about the x axis, $\theta_{g1}$; and the roll angle about the y axis, $\Phi_{g1}$.

In accordance with the foregoing plane fit or a similar quantitative deflection analysis operation, z-stage 540 may be manipulated or otherwise controlled to perform an incremental move in z, pitch, roll, or some combination thereof, to perform a first order correction for measured deflections. Such an incremental move or positional adjustment may be made relative to the nominal overtravel position, and may generally be defined as set forth in Equations 3-5 below:

$$\Delta Z_{1cmd} = -\delta_{g1center} \quad (3)$$

$$\theta_{1cmd} = -\theta_{g1} \quad (4)$$

$$\Phi_{1cmd} = -\Phi_{g1} \quad (5)$$

where axial rotations are performed about the center of fiducial plate 522.

These incremental moves or adjustments may have the effect of establishing a first order correction for deflection effects. In many cases, this first order correction will be sufficient to accommodate the dominant deflection characteristics, to correct for any effects caused thereby, and to model a desired level of uniform overtravel. Due largely to flexure, deformation, or other material deflection or compliance, it is possible that the full extent of the commanded or desired incremental move (whether z translation or x or y rotation) may not be realized in some applications.

In that regard, it will be appreciated that any deviation from the foregoing commanded or desired adjustment generally represents a second order deflection error. If a higher level of accuracy (than that provided by the first order correction set forth above) in compensation is desired, the deflection rate of fiducial plate 522 may also be precisely identified; a second incremental move or adjustment may then enable elimination or minimization of such second order error effects. In some applications, for example, a second order correction may be accomplished by measuring deflection of fiducial plate 522 over the same area as measured prior to the first incremental move. This second deflection analysis may allow acquisition of a set of measurements as expressed below in Equation (6):

$$p_{2i} = (x_1, y_1, \delta_{g2}i)(i=1,2,\ldots,n) \quad (6)$$

Again, these measurements, $p_{2i}$, may be fit to a best-fit plane, such as with a linear least squares technique or other suitable statistical mechanism, to identify the central deflection and rotations of fiducial plate 522 ($\delta_{g2center}$, $\theta_{g2}$, and $\Phi_{g2}$). The second order translational and rotational deflection rates may be computed via Equations (7-9):

$$f_z = (\delta_{g2center} - \delta_{g1center})/\delta_{g1center} \quad (7)$$

$$f_\theta = (\theta_{g2} - \theta_{g1})/\theta_{g1} \quad (8)$$

$$f_\Phi = (\Phi_{g2} - \Phi_{g1})/\Phi_{g1} \quad (9)$$

An additional incremental overtravel command, relative to the nominal overtravel position (i.e., no deflection compensation position), may then be expressed as follows in Equations (10-12):

$$\Delta z_{1cmd} = \delta_{g1center}[1/(1-f_z)] \quad (10)$$

$$\theta_{1cmd} = \theta_{g1}[1/(1-f_\theta)] \quad (11)$$

$$\Phi_{1cmd} = \Phi_{g1}[1/(1-f_\Phi)] \quad (12)$$

At the completion of such a second incremental move, with the exception of errors due to bending variations in fiducial plate 522 over the array of probes 533, the full desired overtravel may be achieved.

Probe Card and Fixture Deflection

In accordance with some embodiments, deflection effects caused by deflection or other deformation of probe card 532, of fixture 531, or of both may be considered. Assuming no a priori knowledge of the relative compliance of the two foregoing components, the compliance effects of each may be combined together, and therefore a combined card/fixture deflection measurement may be obtained.

In one exemplary embodiment, the relationship between measured optical planarity and electrical planarity may be expressed generally as set forth below in Equation (13):

$$p_{einb} = p_{oinb} + \delta_{ginb} + \delta_{cfinb} + \delta_{sinb} \quad (13)$$

The quantities $p_{einb}$ and $p_{oinb}$, represent the electrical and optical planarity, respectively, at a non-bussed probe, $i_{nb}$. The remaining three terms, $\delta_{ginb}$, $\delta_{cfinb}$, and $\delta_{sinb}$, represent the deflection of fiducial plate 522, the combined probe card/fixture deflection, and the deflection of z-stage 540, respectively, at a non-bussed probe, $i_{nb}$, at the time of its first electrical contact. As set forth in detail above with specific reference to FIG. 6, the term $\delta_{sinb}$ may be made effectively zero, for example, using appropriate z-sensor data from a suitable location.

Solving for the card/fixture deflection, $\delta_{cfinb}$, in Equation (13) yields:

$$\delta_{cfinb} = p_{einb} - p_{oinb} - \delta_{ginb} - \delta_{sinb} \quad (14)$$

The sole unknown term in Equation (14) is the deflection in fiducial plate 522 at first electrical contact, $\delta_{ginb}$. The present disclosure contemplates several mechanisms for measuring or estimating this first touch plate deflection, $\delta_{ginb}$.

The most direct method of computing $\delta_{ginb}$ is to adjust optical assembly 550 to image directly opposite each probe 533 as it makes contact with fiducial plate 522, and to measure the deflection of fiducial plate 522 at that point. This approach, however, comes at the expense of both complexity and time, as two-dimensional motion of optics assembly 550 (in both the x and y directions), fiducial plate 522, or both, is required accurately to position optics assembly 550 and to measure the deflection of fiducial plate 522 at each probe 533 as it comes into first contact.

Another approach for computing $\delta_{ginb}$ is based upon an assumption that loading of fiducial plate 522, both with respect to forces and to roll and pitch moments, may be treated as approximately linear with total cumulative probe overtravel. In this context, the term "total cumulative probe overtravel" generally refers to the sum of all the overtravel components (each of which may be respectively attributable to each individual probe 533) from respective first touch to the current position. For most probe cards under typical probe to fiducial plate leveling conditions, this assumption of linear total cumulative loading is a good assumption. One notable exception arises in the case of probe cards utilizing vertical buckle beam technology, but even this technology has linearly increasing loads from first touch to the point just prior to buckling.

Given the foregoing linearity assumption, the first touch fiducial plate deflection may be calculated as a function of full overtravel fiducial plate deflection, $\delta_{gfinb}$, at a particular probe ($i_{nb}$) and knowledge of the optical planarity, $p_{oinb}$.

Initially, the total cumulative overtravel from first touch to the final overtravel position may be determined in accordance with Equation (15):

$$OT_{total} = \begin{cases} \sum_{i=0}^{R} z_{final} - p_{0_i} & \text{linear technology} \\ \sum_{i=0}^{R} \min(z_{final} - p_{0_i}, \delta_{z_{buckle}}) & \text{buckle beam technology} \end{cases} \quad (15)$$

where the quantity $z_{final}$ generally represents the final overtravel position as determined by Equation (10) set forth above, and the quantity $\delta_{z_{buckle}}$ generally represents the probe buckling distance. Then, for every probe, i, the total linear overtravel required to reach it from first touch is given by Equation (16) set forth below. In this context, "total linear overtravel" refers to the total overtravel distance over which the loads are linearly increasing with displacement.

$$OT_i = \begin{cases} \sum_{j=1}^{R} \max(p_{0_i} - p_{0_j}, 0) & \text{linear technology} \\ \sum_{j=1}^{R} \min(\max(p_{0_i} - p_{0_j}, (i)\delta_{z_{buckle}}) & \text{buckle beam technology} \end{cases} \quad (16)$$

Under the assumption of load linearity with cumulative overtravel, the fiducial plate deflection at first touch is simply expressed as the fiducial plate deflection at full overtravel multiplied by the ratio of the cumulative overtravel to first touch to the total cumulative overtravel. This is expressed mathematically as set forth below in Equation (17):

$$\delta_{ginb} = \delta_{gfinb}(OT_{inb}/OT_{total}) \quad (17)$$

Given Equation (14), the combined card/fixture deflection at every non-bussed probe, $i_{nb}$, may be computed. Fixture deflection at other locations can readily be determined and quantified by two dimensional interpolation.

Load Compensated Optical Planarity

Equation (13) sets forth a relationship between electrical and optical planarity. This equation allows loaded planarity to be calculated. By taking the measured optical planarity for a given probe and adding the first touch card/fixture deflection observed at that probe, the equivalent loaded planarity may be expressed as indicated in Equation (18):

$$p_{1i} = p_{oi} + \delta_{cf}(x_i, y_i) \quad (18)$$

The term $\delta_{cf}(x_i, y_i)$ in Equation (18) requires a two dimensional interpolation to evaluate. This interpolation to model characteristics at the location of a probe, i, may be performed on the ordered triplet of data ($x_{inb}$, $y_{inb}$, $\delta_{cfinb}$) evaluated at a point ($x_i$, $y_i$).

Figure 9:
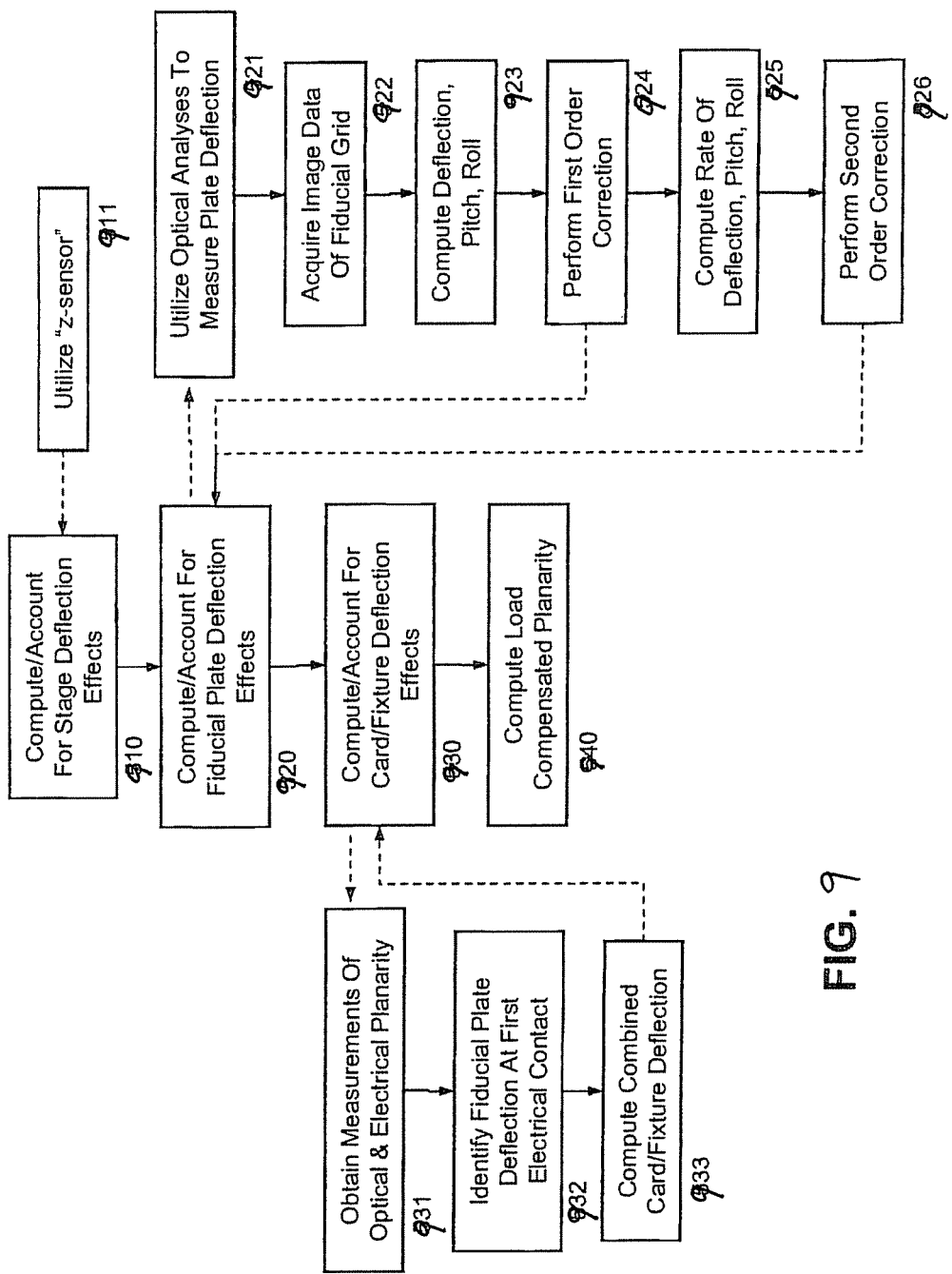
FIG. 9 is a simplified flow diagram illustrating the general operation of one embodiment of a method of obtaining planarity measurements in a probe card analysis system.

FIG. 9 is a simplified flow diagram illustrating the general operation of one embodiment of a method of obtaining planarity measurements in a probe card analysis system. As indicated at the center of FIG. 9, an exemplary method of obtaining planarity measurements may generally comprise computing or accounting for stage deflection effects (block 910), computing or accounting for fiducial plate deflection effects (block 920), computing or accounting for probe card and probe fixture deflection effects (block 930), and computing load compensated planarity (block 940).

One exemplary mechanism for mitigating stage deflection effects contributing to planarity errors employs a direct measurement acquired as close as possible to the fiducial plate and to the probe card fixture, i.e., acquiring stage deflection measurements at proximal sensor locations, where "proximal" in this context generally refers to the vicinity of the fiducial plate and the probe card fixture where stage deflection is most likely to occur. Applications employing an appropriately disposed direct measurement sensor were described above with specific reference to FIGS. 5 and 6. As indicated at block 911, accounting for planarity effects due to stage deflection may comprise utilizing a distance sensor (e.g., z-sensor 541 in the FIG. 6 embodiment) proximate to the stage deflection.

Various methods of computing fiducial plate deflection effects such as depicted at block 920 are set forth in detail above with specific reference to FIGS. 7 and 8. Specifically, the operation at block 920 represents a process by which the amount of deflection that has occurred in the area of the fiducial plate that contacts the array of probes may be accurately measured.

As set forth above, optical analyses for measuring fiducial plate deflection (block 921) may involve acquiring image data of one or more fiducials in a grid or predetermined pattern on the fiducial plate (block 922). The image data acquisition process depicted at block 922 may employ a CCD or CMOS device, for example, and may additionally require or benefit from other optical components. In some embodiments, image data may be acquired from different perspectives, such as from two or more perspectives, and under different load conditions, such as a loaded condition and a no-load condition. In particular, the imaging operation at block 922 may result in acquisition of visual or other image data of the fiducial grid in a no-load condition and in a loaded condition, wherein each condition is imaged from two perspectives. Accordingly, measurements may be taken of the grid structure under differing conditions and from multiple imaging perspective.

The foregoing measurements may be employed to compute deflection, pitch, and roll of the fiducial plate (block 923) which may be compensated, for example, with a first order correction (block 924) as set forth above with particular reference to Equations 1-5. The dashed arrow from block 924 back to block 920 is intended to indicate that accounting for fiducial plate deflections may terminate at block 924, i.e., second or higher order corrections may be neither required nor desired. Deflection, pitch, and roll rates for the fiducial plate (block 925) may additionally be computed, allowing a second order correction (block 926) as set forth above with reference to Equations 6-12. Those of skill in the art will appreciate that the exemplary computations set forth herein are susceptible of numerous modifications and may be altered or influenced by, for example, overall system configuration and mechanical precision, resolution of the imaging apparatus employed, computational capabilities of data processing components, desired accuracy of corrections, and other factors. Corrections beyond the second order are also possible and may readily be implemented with appropriate hardware and data processing capabilities.

As indicated in FIG. 9, computing or accounting for probe card and probe card fixture deflection effects (block 930) may generally comprise obtaining measurements of optical planarity and measurements of electrical planarity (block 931) for all non-bussed probes, identifying fiducial plate deflection at first electrical contact (block 932) at all non-bussed probe locations, and computing a combined deflection (block 933) attributable to deflection of the probe card and deflection of the probe card fixture. By way of example, the various operations depicted at blocks 930-933 may be executed substantially as set forth above with specific reference to Equations 13-17.

Similarly, computing the load compensated planarity (block 940) may be executed substantially as described above. The relationship between electrical and optical planarity, such as expressed in Equation (13), for example, may allow loaded planarity to be calculated as a function of the measured optical planarity for a given probe and the first touch card/fixture deflection observed at that probe.

Figure 10:
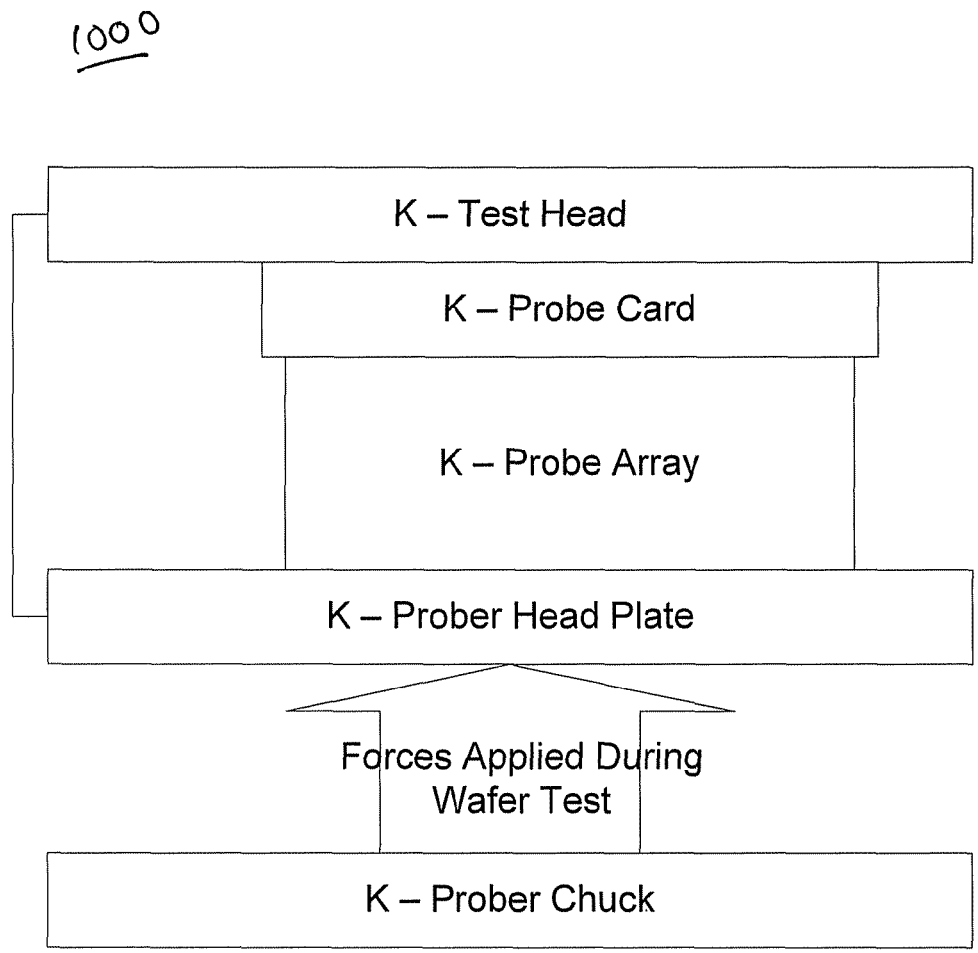
FIG. 10 is a simplified block diagram illustrating modeling spring constants for components in a wafer test cell.
Figure 11:
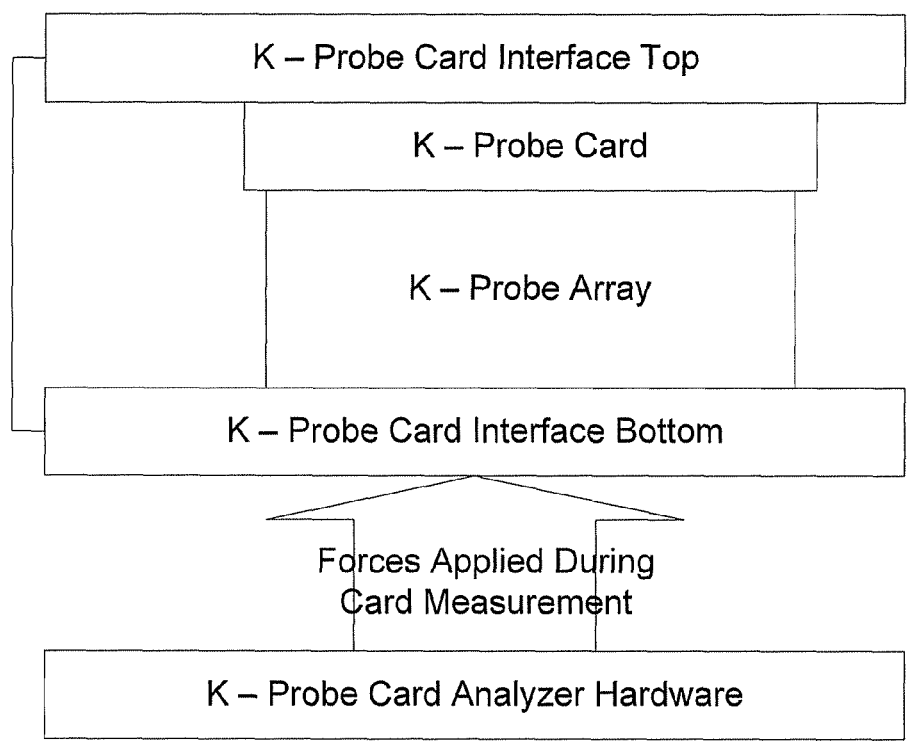
FIG. 11 is a simplified block diagram illustrating modeling spring constants for components in a probe card analyzer module.

Another approach to modeling forces in a wafer test cell and/or probe array analyzer module is shown in FIGS. 10 and 11, respectively. In particular, the components in the wafer test cell 1000 (FIG. 10) and probe array analyzer module 1100 (FIG. 11) are modeled as springs, each component having a spring constant (denoted K). Within both the wafer test cell and probe array analyzer module, physical objects react to loads differently based on material, shape and size of the objects and the way in which loads are resisted and supported. The object of interest for probe array analyzer module 1100 is the probe card, and for "under load" measurements in a wafer test cell 1000, the probe array and the individual probes. By understanding what loads are present in the wafer test cell 1000, emulation of forces in probe array analyzer module 1100 can be achieved, or in an alternative emulation system as illustrated in FIG. 12.

The probe card is the same physically whether on the test cell 1000 of FIG. 10 or the probe array analyzer module 1100 of FIG. 11. However, the support structures that resist applied forces are significantly different. Various structural components in the load scenario can effectively be modeled as simple springs with each one having a spring constant. By characterizing these spring constants on the analyzer of FIG. 11, and if this information is paired with similar information from the test cell of FIG. 10, the analyzer can then collect positional results in one system of springs and scenario, where larger or different K values exist.

Figure 12:
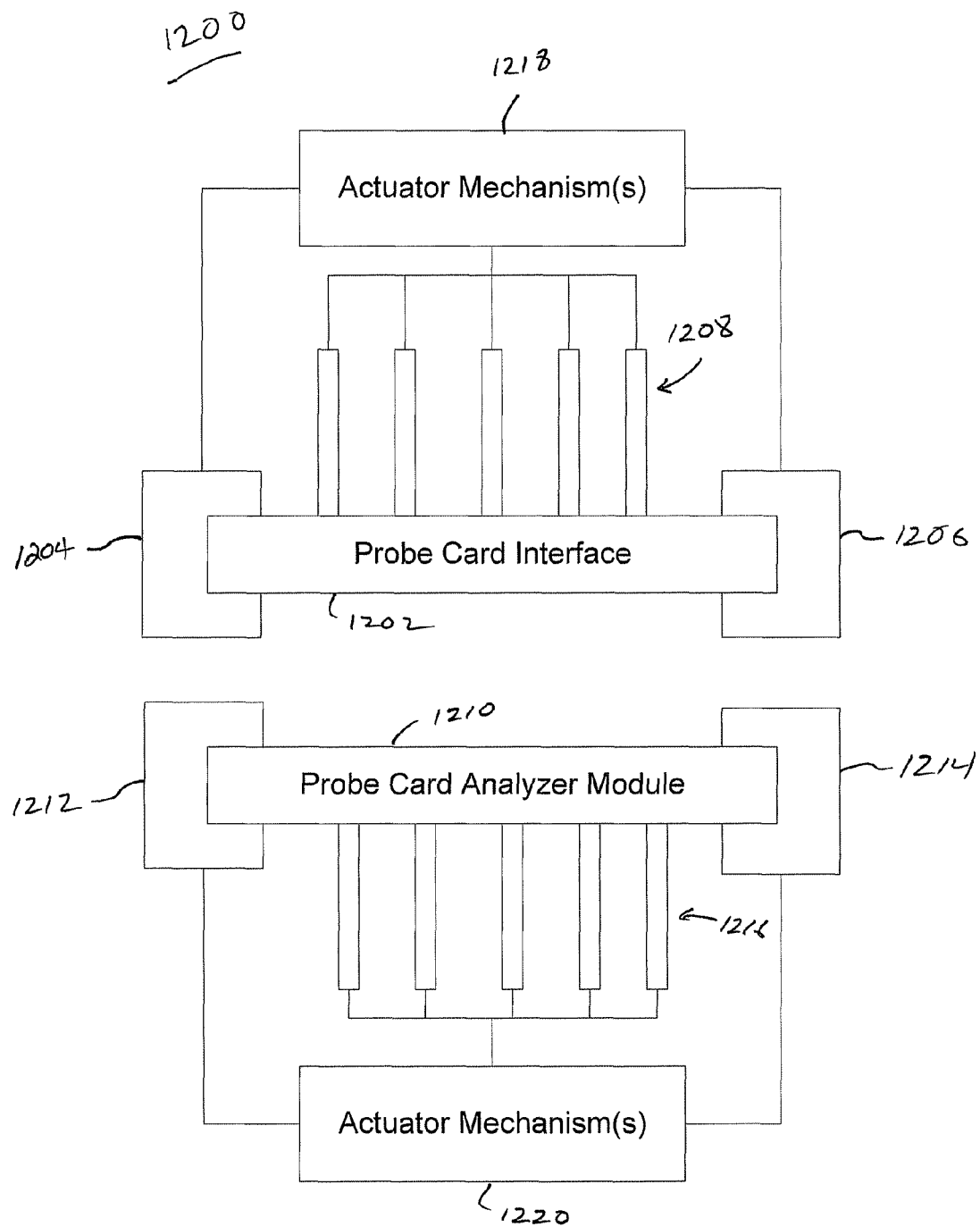
FIG. 12 is a simplified block diagram for emulating loads on a probe card in an emulation system.

FIG. 12 is a schematic block diagram of an emulation system 1200 configured to emulate forces on a probe card or array (not shown) such that the probe ccard experiences similar forces to that experienced within a wafer test cell. System 1200 includes a probe card interface 1202 and an analyzer module 1210. Interface 1202 holds the probe card and module 1210 is adapted to interface with probes of the probe card akin to the probe array analyzer modules discussed above. A number of engagement structures 1204, 1206 and 1208 are configured to engage the probe card interface 1202 and apply forces thereto in order to emulate forces placed on the probe card as would be applied in a corresponding wafer cell. In particular, these forces occur in several directions, including pitch, roll and yaw. Additionally, engagement structures can alter a shape of the probe card, as can further be measured when the card is positioned within a test cell. One or more actuator mechanisms 1218 operate to actuate the engagement structures 1205, 1206 and 1208 to model and emulate these forces. Similarly, engagement structures 1212, 1214 and 1216 engage module 1216 to provide forces thereto indicative of forces observed while the probe card was in a corresponding wafer test cell. One or more actuator mechanism(s) can operate to move these engagement structures 1212, 1214 and 1216 to emulate the test cell conditions. Moreover, the engagement structures can alter a shape of components of the probe card analyzer module 1210, such as a fiducial plate that engages tips of the probe card.

Aspects of the present disclosure have been illustrated and described in detail with reference to particular embodiments by way of example only, and not by way of limitation. It will be appreciated that various modifications and alteration may be made to the exemplary embodiments without departing from the scope and contemplation of the present disclosure.

What is claimed is:

1. A system comprising:
   a probe card comprising an array of probes;
   an actuator mechanism operably coupled to the probe card to apply forces thereto independent of forces placed on the array of probes to emulate physical characteristics of a wafer test cell; and
   a sensor measuring deflection of the probe card based on the applied forces.

2. The system of claim 1, wherein the actuator mechanism is coupled to a probe card interface.

3. The system of claim 1, wherein the actuator mechanism is coupled to a probe card analyzer module.

4. The system of claim 1, wherein the actuator mechanism is configured to place forces on the probe array in pitch, roll and yaw directions.

5. The system of claim 1, wherein the actuator mechanism is configured to alter a shape of the probe card.

6. The system of claim 1, wherein the actuator mechanism is configured to alter a shape of a probe card analyzer module that engages tips of the probe card.

7. The system of claim 1, wherein the sensor is coupled to a processor that models the applied forces to estimate a spring constant associated with the probe card.

8. A method for inspecting and analyzing wafer test probe arrays, said method comprising:
   mounting a probe card having a probe array to an emulation system;
   emulating forces on the probe card in the emulation system independent of forces placed on the probe array indicative of physical characteristics of a wafer test cell; and
   measuring deflection of the probe card based on the emulated forces.

9. The method of claim 8 further comprising altering a shape of the probe card.

10. The method of claim 8 further comprising altering a shape of a probe card analyzer module engaging tips of the probe card.

11. The method of claim 8, further comprising:
    estimating a spring constant of the probe card based on the emulated forces.

* * * * *

UNITED STATES PATENT AND TRADEMARK OFFICE
CERTIFICATE OF CORRECTION

| | | |
|---|---|---|
| PATENT NO. | : 8,466,703 B2 | Page 1 of 1 |
| APPLICATION NO. | : 12/862375 | |
| DATED | : June 18, 2013 | |
| INVENTOR(S) | : Eric Andres et al. | |

It is certified that error appears in the above-identified patent and that said Letters Patent is hereby corrected as shown below:

In the Drawings

Sheet 8 of 13 (Fig. 7), delete "Proce" and insert --Probe--.

In the Specification

Column 6, line 18, delete "50" and insert --250,--.

Column 6, line 26, delete "50" and insert --250,--.

Column 7, line 2, delete "and or" and insert --and/or--.

Column 9, line 38, after "operably coupled" delete "to couple".

Column 14, line 12, delete "Equation (2)" and insert --Equation (2):--.

Column 15, line 36, delete " $p_{einb} = p_{oinb} + \delta_{ginb} + \delta_{cfinb} + \delta_{sinb}(13)$ " and insert in place thereof -- $p_{einb} = p_{einb} + \delta_{ginb} + \delta_{cfinb} + \delta_{sinb}(13)$ --.

Column 18, line 53, delete "ccard" and insert --card--.

Signed and Sealed this
Eighth Day of October, 2013

Teresa Stanek Rea
*Deputy Director of the United States Patent and Trademark Office*